United States Patent
Khayat et al.

(10) Patent No.: US 9,294,082 B2
(45) Date of Patent: Mar. 22, 2016

(54) CIRCUIT FOR CURRENT SENSING IN HIGH-VOLTAGE TRANSISTOR

(71) Applicant: Texas Instruments Incorporated, Dallas, TX (US)

(72) Inventors: Joseph M. Khayat, Bedford, NH (US); Marie Denison, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/516,947

(22) Filed: Oct. 17, 2014

(65) Prior Publication Data

US 2015/0102841 A1 Apr. 16, 2015

Related U.S. Application Data

(62) Division of application No. 13/554,846, filed on Jul. 20, 2012, now Pat. No. 8,890,579.

(51) Int. Cl.
*H03K 3/00* (2006.01)
*H03K 17/08* (2006.01)

(52) U.S. Cl.
CPC ........ *H03K 17/08* (2013.01); *H03K 2217/0027* (2013.01)

(58) Field of Classification Search
CPC .................. H03K 17/08; H03K 2217/0027
USPC .......................................... 327/108; 361/93.1
See application file for complete search history.

(56) References Cited

U.S. PATENT DOCUMENTS

| | | | | |
|---|---|---|---|---|
| 4,553,084 | A * | 11/1985 | Wrathall | 323/316 |
| 5,646,520 | A * | 7/1997 | Frank et al. | 324/762.01 |
| 7,336,085 | B2 * | 2/2008 | Fabbro et al. | 324/713 |
| 7,573,689 | B2 * | 8/2009 | Hojo | 361/93.1 |
| 8,497,671 | B2 * | 7/2013 | Kanemitsu | 323/312 |
| 8,890,579 | B2 * | 11/2014 | Khayat et al. | 327/108 |

* cited by examiner

*Primary Examiner* — Kenneth B Wells
(74) *Attorney, Agent, or Firm* — William B. Kempler; Frank D. Cimino

(57) ABSTRACT

An integrated circuit including a high-voltage n-channel MOS power transistor, a high-voltage n-channel MOS blocking transistor, a high-voltage n-channel MOS reference transistor, and a voltage comparator, configured to provide an overcurrent signal if drain current through the power transistor in the on state exceeds a predetermined value. The power transistor source node is grounded. The blocking transistor drain node is connected to the power transistor drain node. The blocking transistor source node is coupled to the comparator non-inverting input. The reference transistor drain node is fed by a current source and is connected to the comparator inverting input. The reference transistor gate node is coupled to a gate node of the power transistor. The comparator output provides the overcurrent signal. A process of operating the integrated circuit is disclosed.

7 Claims, 6 Drawing Sheets

CIRCUIT FOR CURRENT SENSING IN HIGH-VOLTAGE TRANSISTOR

CROSS-REFERENCE TO RELATED APPLICATIONS

This application is a divisional of U.S. patent application Ser. No. 13/554,846, filed on Jul. 20, 2014 (Now U.S. Pat. No. 8, 890, 579), and is related to patent application U.S. patent application Ser. No. 13/554,863 (now U.S. Pat. No. 8,648, 416), which is incorporated herein by reference.

FIELD OF THE INVENTION

This invention relates to the field of integrated circuits. More particularly, this invention relates to high-voltage transistors in integrated circuits.

BACKGROUND OF THE INVENTION

An integrated circuit may contain a high-voltage n-channel metal oxide semiconductor (MOS) power transistor which is configured to operate at a drain voltage which is significantly higher than an operating voltage for other transistors and circuits in the integrated circuit. For example, an integrated circuit which contains transistors and circuits which operate at 10 volts or less may also include a high-voltage n-channel MOS power transistor which operates at a drain voltage of over 300 volts and switches several amps. The body of the power transistor may be directly connected to the substrate of the integrated circuit, for example to provide a simpler fabrication process for the integrated circuit, compared to an integrated circuit with a high-voltage power transistor whose body is electrically isolated from the substrate. It may be desirable to determine if current through the power transistor is above a certain value when the power transistor is in the on state, without increasing the fabrication complexity of the integrated circuit or unduly increasing the size of the integrated circuit.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may include a high-voltage n-channel MOS power transistor whose drain is operated at high voltage, a high-voltage isolated n-channel MOS blocking transistor, a high-voltage n-channel MOS reference transistor whose drain is operated at low voltage, and a voltage comparator, configured to provide an overcurrent signal if drain current through the power transistor in the on state exceeds a predetermined value. A drain node of the blocking transistor is connected to a drain node of the power transistor. A source node of the blocking transistor is coupled to a non-inverting input of the comparator. The blocking transistor is maintained in an off state when the power transistor is in an off state, so as to block high voltage from the comparator. A source node of the reference transistor is grounded and a drain node of the reference transistor is fed by a current source so as to provide a desired voltage on the reference transistor drain node when the reference transistor is in the on state. The reference transistor has the same layer structure as the power transistor with a reduced channel width. A gate node of the reference transistor is coupled to a gate node of the power transistor, so that both the power transistor and the reference transistor are turned off and on by a power transistor gate signal. The drain node of the reference transistor is connected to an inverting input of the comparator. An output of the comparator provides the overcurrent signal.

DETAILED DESCRIPTION OF EXAMPLE EMBODIMENTS

Figure 1:
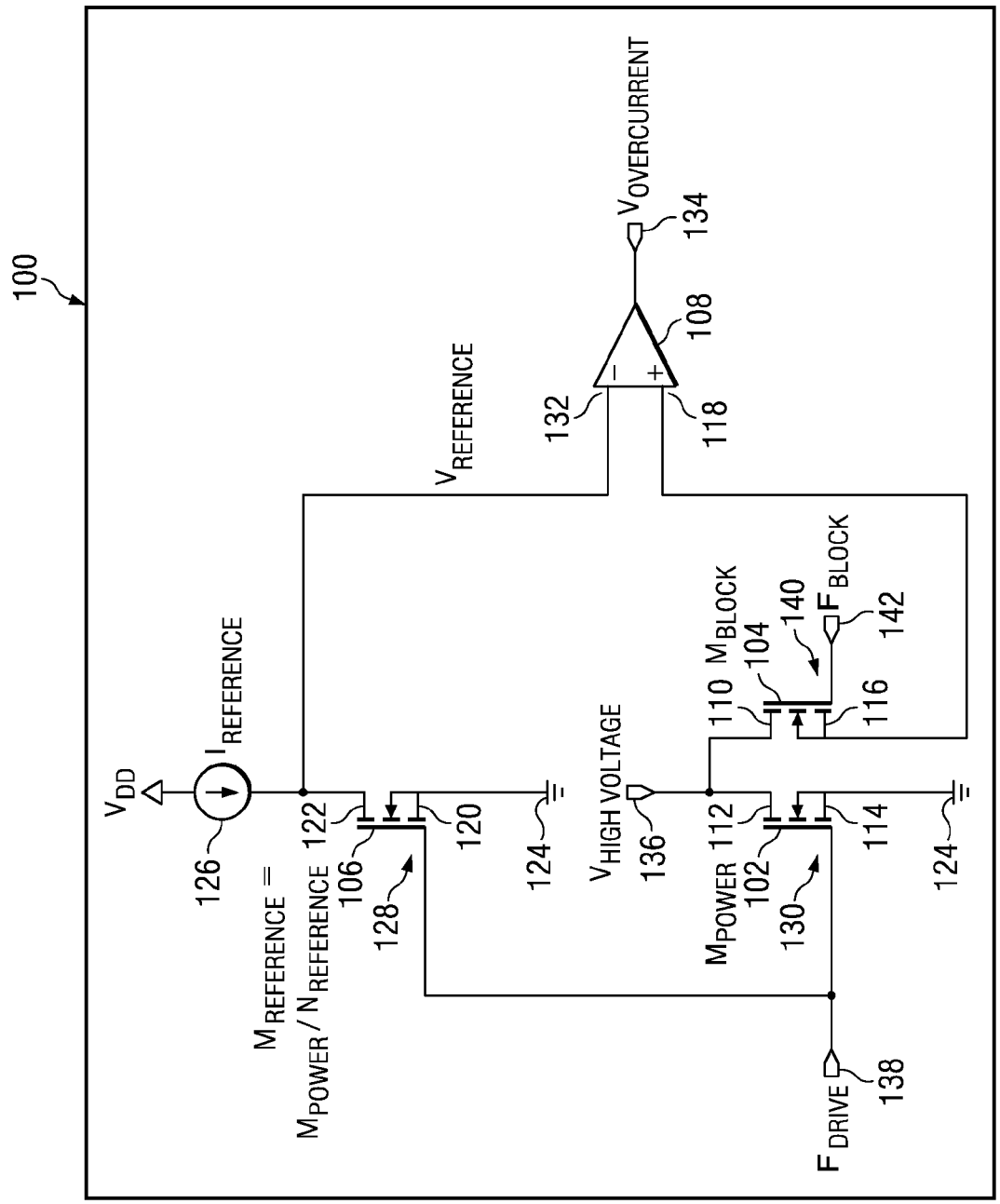
FIG. 1 is a circuit diagram of an integrated circuit according to an embodiment.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may include a high-voltage n-channel MOS power transistor whose drain is operated at high voltage, a high-voltage isolated n-channel MOS blocking transistor, a high-voltage n-channel MOS reference transistor whose drain is operated at low voltage, and a voltage comparator, configured to provide an overcurrent signal if drain current through the power transistor in the on state exceeds a predetermined value. A drain node of the blocking transistor is connected to a drain node of the power transistor. A source node of the blocking transistor is coupled to a non-inverting input of the comparator. The blocking transistor is maintained in an off state when the power transistor is in an off state, so as to block high voltage from the comparator. The reference transistor has a same layer structure as the power transistor with a reduced channel width compared to the power transistor. A source node of the reference transistor is grounded and a drain node of the reference transistor is fed by a current source so as to provide a desired voltage on the reference transistor drain node when the reference transistor is in the on state. A gate node of the reference transistor is coupled to a gate node of the power transistor, so that both the power transistor and the reference transistor are turned off and on by a power transistor gate signal. The drain node of the reference transistor is connected to an inverting input of the comparator. An output of the comparator provides the overcurrent signal.

FIG. 1 is a circuit diagram of an integrated circuit according to an embodiment. The integrated circuit 100 contains a high-voltage n-channel MOS power transistor 102, a high-voltage isolated n-channel MOS blocking transistor 104, a high-voltage n-channel MOS reference transistor 106 and a voltage comparator 108.

A drain node 112 of the power transistor 102 is connected to a high voltage power node 136 labeled $V_{HIGH\ VOLTAGE}$ in FIG. 1, for example through an external pin of a package containing the integrated circuit 100. A source node 114 of the power transistor 102 is directly electrically connected to an instance of a ground node 124 of the integrated circuit 100. A gate node 130 of the power transistor 102 is connected to a power switching signal source 138 labeled $\Phi_{DRIVE}$ in FIG. 1.

A drain node 110 of the blocking transistor 104 is connected to the drain node 112 of the power transistor 102 and thus to the high voltage power node 136. A source node 116 of the blocking transistor 104 is electrically isolated from the integrated circuit ground node, and is coupled to a non-inverting input 118 of the comparator 108. A gate node 140 of the blocking transistor 104 is connected to a blocking switching signal source 142 labeled $\Phi_{BLOCK}$ in FIG. 1. The blocking switching signal source 142 is capable of switching to a blocking transistor off state bias which puts the blocking transistor 104 in an off state bias so that current through the blocking transistor is limited to leakage current, for example less than a microampere. The blocking switching signal source 142 is further capable of switching to a blocking transistor on state bias which puts the blocking transistor 104 in an on state so that the blocking transistor 104 operates in a linear mode in which an on-state drain-source resistance of is less than 1 kohm. In the instant embodiment, the blocking transistor 104 is put in the on state when the blocking switching signal source $\Phi_{BLOCK}$ 142 is high.

The reference transistor 106 is formed concurrently with the power transistor 102 and has a same layer structure as the power transistor 106 with a reduced channel width; the reference transistor has a same drain structure including any extended drain drift layers, a same gate length and gate dielectric layer thickness, and a same threshold as the power transistor 102. The channel width of the power transistor 102 is wide enough to pass a desired current level of at least 0.5 amperes and possibly more than 2 amperes. The channel width of the reference transistor 106 is less by a factor of, for example, 1000 to 5000, so that an on-state resistance of the reference transistor 106 is higher than an on-state resistance of the power transistor 102 by the same factor. The reference transistor 106 is labeled $M_{POWER}/N_{REFERENCE}$ in FIG. 1 and subsequent figures to emphasize the similarity in layer structure and the channel width reduction fact with respect to the power transistor 102. A drain node 122 of the reference transistor 106 is connected to a reference current source 126 labeled $I_{REFERENCE}$ in FIG. 1. A source node 120 of the reference transistor 106 may be connected to an instance of the ground node 124. A gate node 128 of the reference transistor 106 is coupled to the gate node 130 of the power transistor 102 and thus to the power switching signal source 138. The reference transistor 106 is formed so that when the power switching signal source 138 provides an off state bias which is sufficient to put the power transistor 102 into an off state, a potential on the reference transistor gate node 128 is sufficient to put the reference transistor 106 into an off state, and so that when the power switching signal source 138 provides an on state bias which is sufficient to put the power transistor 102 into an on state, the potential on the reference transistor gate node 128 is sufficient to put the reference transistor 106 into an on state. For example, the off state bias of the power switching signal source 138 may be substantially equal to a potential of the ground node 124 of the integrated circuit 100, and the on state bias may be between 5 and 10 volts.

The reference transistor 106 is further formed so that the on-state drain-source resistance of the reference transistor 106 is a desired multiple of the power transistor on-state drain-source resistance, for example, a multiple 1000 to 5000. The reference current source 126 provides a predetermined current so as to provide a desired potential on the reference transistor drain node 120 when the reference transistor 106 is in the on state. In the embodiment of FIG. 1, the desired potential on the reference transistor drain node 122 is equal to the potential on the power transistor drain node 112 when a prescribed maximum current is flowing through the power transistor 102. In one version of the instant embodiment, the desired potential on the reference transistor drain node 122 may be expressed by the relationship $$V_{drain} = R_{power} \times I_{maxpower} = R_{reference} \times I_{reference}$$

where: $V_{drain}$ is desired potential on the reference transistor drain node (122), $R_{power}$ is the on-state resistance of the power transistor (102), $I_{maxpower}$ is the prescribed maximum current through the power transistor (102), $R_{reference}$ is the on-state resistance of the reference transistor (106), and $I_{reference}$ is the predetermined current from the reference current source (126).

The potential on the reference transistor drain node 122 is applied to the comparator inverting input 132 through the electrical connection between the reference transistor drain node 122 and the comparator inverting input 132.

The reference transistor drain node 122 is connected to an inverting input 132 of the comparator 108. An output 134, labeled $V_{OVERCURRENT}$ in FIG. 1, of the comparator 108 provides an overcurrent signal, for example a predetermined voltage level, when a potential at the non-inverting input 118 is higher than a potential at the inverting input 132.

In one version of the integrated circuit 100, the power transistor 102 and the blocking transistor 104 may be integrated as described in the commonly assigned patent application having patent application Ser. No. 13/554,863, filed simultaneously with this application and which is incorporated herein by reference but is not admitted to be prior art with respect to the present invention by its mention in this section. In another version of the integrated circuit 100, the power transistor 102 and the blocking transistor 104 may be spatially separated and function independently. In one version of the integrated circuit 100, the blocking transistor drain node 110 is electrically connected to the power transistor drain node 112 in the integrated circuit 100, for example by electrically wirebonding each high voltage drain to a same pin on the package of the integrated circuit 100 which provides the high voltage to both drain nodes 110 and 112. In another version, the blocking transistor 104 may be integrated with the power transistor 102, so that silicon area of the integrated circuit 100 can be reduced by having a single wirebond connection to the external pin on the package which provides the high voltage.

Figure 2:
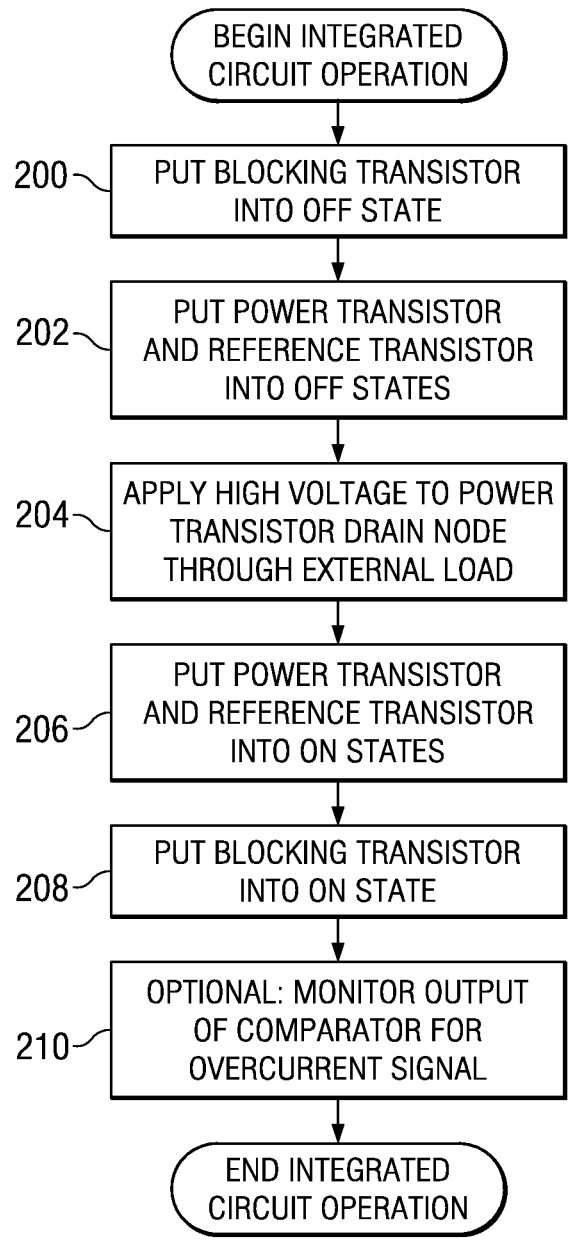
FIG. 2 is a flowchart of a process of operating the integrated circuit described in reference to FIG. 1.

FIG. 2 is a flowchart of a process of operating the integrated circuit described in reference to FIG. 1. The process begins with step 200 which is to put the blocking transistor 104 into the off state. In the embodiment described in reference to FIG. 1, step 200 may be performed by switching the blocking switching signal source 142 to the blocking transistor off state bias. In other embodiments, the blocking switching signal source 142 may be coupled to the blocking transistor gate node 140 through additional circuitry so as to provide the blocking transistor off state bias.

Subsequently, step 202 is executed, in which the power transistor 102 and the reference transistor 106 are put in their respective off states by applying the off state bias of the power switching signal source 138 to the power transistor gate node 130 and the blocking transistor gate node 140. When the power transistor 102 is in the off state, current through the external load is limited to leakage current of the power transistor 102, for example less than a microampere, so that the high voltage appears at the blocking transistor drain node 110. When the power transistor 102 is in the off state, the blocking transistor 104 is maintained in the off state so as to block high voltage from the comparator non-inverting input 118.

Subsequently, step 204 is executed, in which a high voltage, for example at least 300 volts and possibly no more than 1000 volts, is applied through an external load, not shown, to the power transistor drain node 112. The high voltage is also applied to the blocking transistor drain node 110 through the electrical connection between the power transistor drain node 112 and the blocking transistor drain node 110.

Subsequently, step 206 is executed, in which the power transistor 102 and the reference transistor 106 are put in their respective on states by applying the on state bias of the power switching signal source 138 to the power transistor gate node 130 and the reference transistor gate node 128. An on-state drain-source resistance of the power transistor 102 may be, for example, between 5 and 10 ohms. The high voltage through the external load may provide, for example up to 1 to 2 amps through the power transistor 102, so that the power transistor drain node 112 is at a potential of, for example, 5 to 20 volts.

After the power transistor 102 is put into the on state, step 208 is executed in which the blocking switching signal source 142 is switched to the blocking transistor on state bias which puts the blocking transistor 104 in the on state so that the potential on the power transistor drain node 112 is applied through the blocking transistor 104 to the comparator non-inverting input 118. When the current through the power transistor 102 exceeds the prescribed maximum current, the potential at the comparator non-inverting input 108 will be higher than the potential at the comparator inverting input 132 and the overcurrent signal will be provided at the comparator output 134.

Steps 200 through 208 may be repeated as needed to operate the integrated circuit 100. For example, in an embodiment of FIG. 2 in which the integrated circuit 100 is switching current through a load connected to the high voltage power node 136, steps 200 through 208 may be repeated each time the current is switched. A process of shutting down the integrated circuit 100 may include steps 200 and 202.

Subsequently, optional step 210 is to monitor the comparator output 134 to determine if the overcurrent signal is present. Appropriate action may be taken in the integrated circuit 100 or external to the integrated circuit 100 when the overcurrent signal is detected. Optional step 210 may be repeated as necessary for desired operation of the integrated circuit 100.

Figure 3:
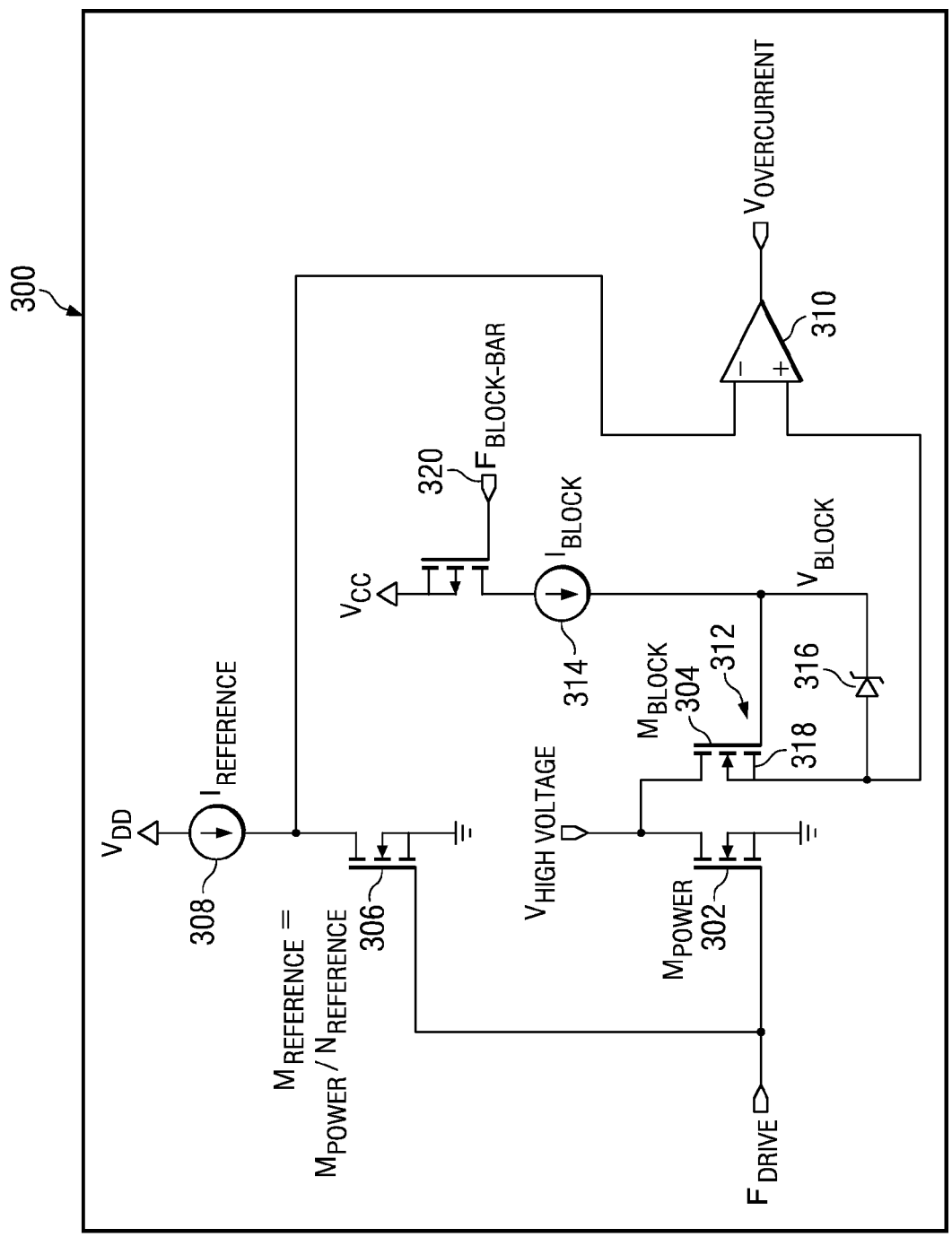
FIG. 3 is a circuit diagram of an integrated circuit similar to that described in reference to FIG. 1, in which a gate node of a blocking transistor is controlled according to another embodiment.

FIG. 3 is a circuit diagram of an integrated circuit similar to that described in reference to FIG. 1, in which a gate node of a blocking transistor is controlled according to another embodiment. The integrated circuit 300 contains a power transistor 302 in parallel with a blocking transistor 304, a reference transistor 306 in series with a reference current source 308, and a comparator 310, configured as described in reference to FIG. 1. In the instant embodiment, the blocking transistor off state bias and blocking transistor on state bias are applied to a gate node 312 of the blocking transistor 304 by a series combination of a blocking signal current source 314, labeled $I_{BLOCK}$ in FIG. 3, and a zener diode 316. An anode of the zener diode 316 is connected to a source node 318 of the blocking transistor 304 and a cathode of the zener diode 316 is connected to the blocking transistor gate node 312. The blocking signal current source 314 is switched on and off by a blocking switching signal source 320 labeled $\Phi_{BLOCK\text{-}BAR}$ in FIG. 3. The zener diode 316 is formed so that current from the blocking signal current source 314 through the zener diode 316 generates a blocking transistor on state bias at the blocking transistor gate node 312 which puts the blocking transistor 304 in the on state. In the instant embodiment, the blocking transistor 304 is put in the on state when the blocking switching signal source $\Phi_{BLOCK\text{-}BAR}$ 320 is low. The zener diode 316 also protects the blocking transistor gate node 312 from too much voltage from the blocking signal current source 314.

Figure 4:
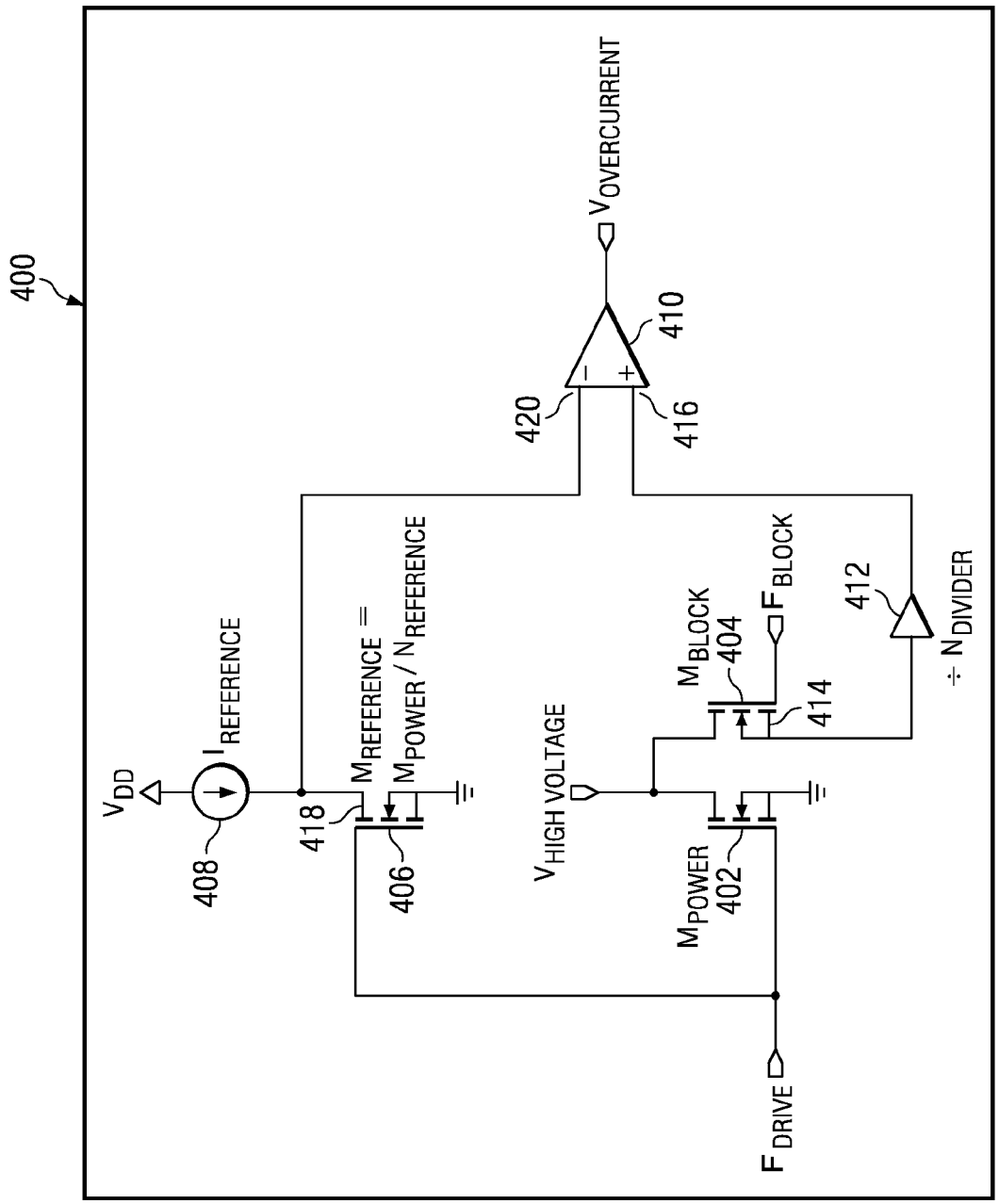
FIG. 4 is a circuit diagram of an integrated circuit similar to that described in reference to FIG. 1, in which a drain potential at the power transistor is reduced by a voltage divider to provide a lower potential at the non-inverting input of the comparator.

FIG. 4 is a circuit diagram of an integrated circuit similar to that described in reference to FIG. 1, in which a drain potential at the power transistor is reduced by a voltage divider to provide a lower potential at the non-inverting input of the comparator. The integrated circuit 400 contains a power transistor 402 in parallel with a blocking transistor 404, a reference transistor 406 in series with a reference current source 408, and a comparator 410, configured as described in reference to FIG. 1. A voltage divider 412 is connected in series between a source node 414 of the blocking transistor 404 and the non-inverting input 416 of the comparator 410. The voltage divider 412 reduces the potential at the blocking transistor source node 414 by a factor of $N_{divider}$, where $N_{divider}$ is a positive number greater than 1, for example 5 to 20, and provides the reduced potential to the non-inverting input 416 of the comparator 410. The embodiment of FIG. 4 may advantageously allow use of lower voltage circuitry to form the comparator. The reference current source 408 is formed so as to provide an appropriately scaled current, so that a potential on a drain node 418 of the reference transistor 406, and thus at the inverting input 420 of the comparator 410, matches the scaled voltage at the blocking transistor source node 414 when the prescribed maximum current is flowing through the power transistor 402, as expressed by the relationship:

$$R_{power} \times I_{maxpower} = N_{divider} \times R_{reference} \times I_{reference}$$

where: $R_{power}$ is the on-state resistance of the power transistor (402), $I_{maxpower}$ is the prescribed maximum current through the power transistor (402), $N_{divider}$ is dividing factor of the voltage divider (412), $R_{reference}$ is the on-state resistance of the reference transistor (406), and $I_{reference}$ is the predetermined current from the reference current source (408).

Figure 5:
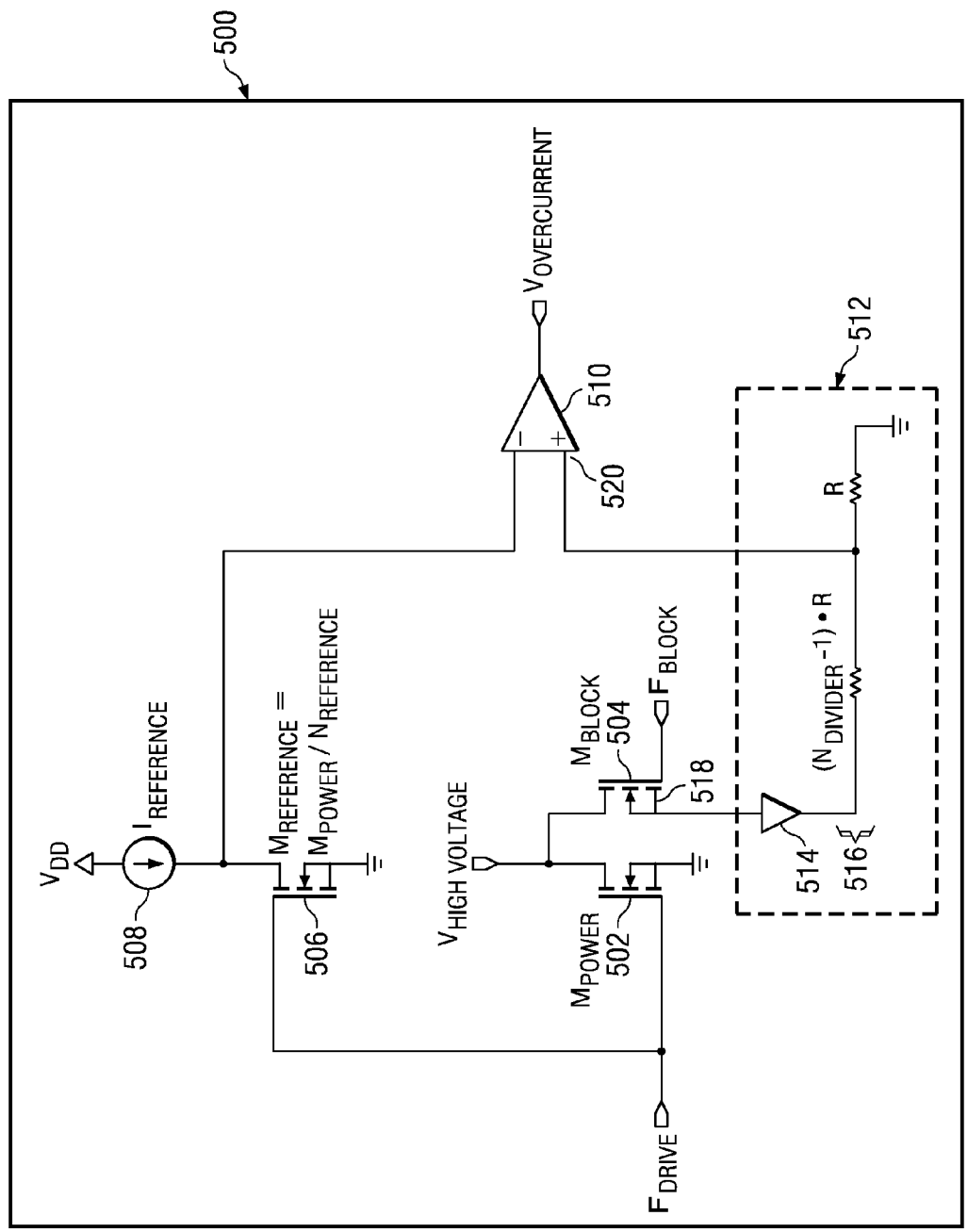
FIG. 5 is a circuit diagram of an integrated circuit similar to that described in reference to FIG. 4, depicting a particular embodiment of the voltage divider.

FIG. 5 is a circuit diagram of an integrated circuit similar to that described in reference to FIG. 4, depicting a particular embodiment of the voltage divider. The integrated circuit 500 contains a power transistor 502 in parallel with a blocking transistor 504, a reference transistor 506 in series with a reference current source 508, and a comparator 510, configured as described in reference to FIG. 1. The voltage divider 512 includes a buffer 514 in series with a resistor divider network 516 to ground. The buffer 514 provides a same potential on a source node 518 of the blocking transistor 504 to a top of the resistor divider network 516. The resistor divider network 516 reduces the potential at a top node top of the resistor divider network 516 by a factor of $N_{divider}$, for example 5 to 20, and provides the reduced potential to a non-inverting input 520 of the comparator 510.

Figure 6:
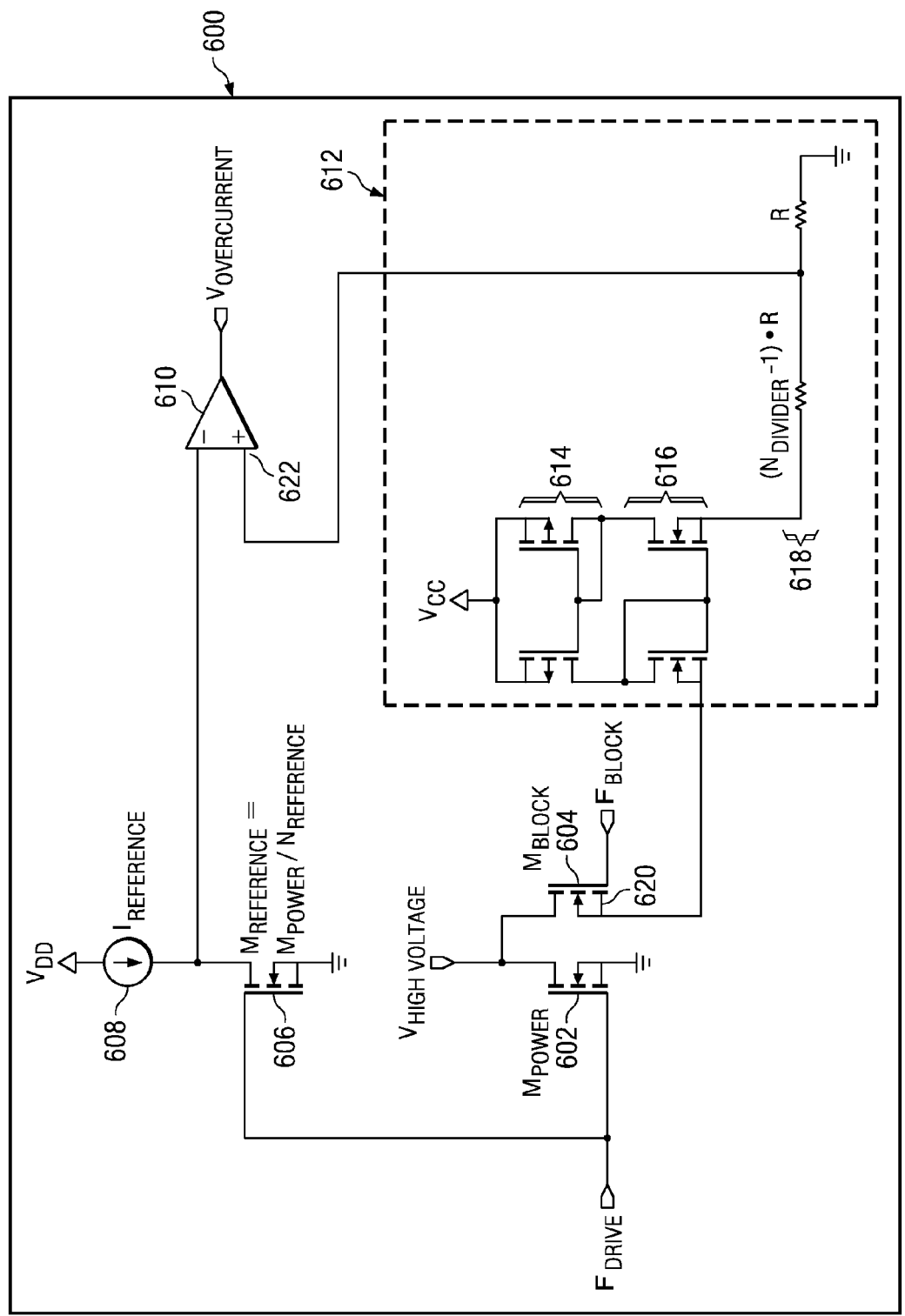
FIG. 6 is a circuit diagram of an integrated circuit similar to that described in reference to FIG. 5, depicting more specific embodiment of the voltage divider.

FIG. 6 is a circuit diagram of an integrated circuit similar to that described in reference to FIG. 5, depicting more specific embodiment of the voltage divider. The integrated circuit 600 contains a power transistor 602 in parallel with a blocking transistor 604, a reference transistor 606 in series with a reference current source 608, and a comparator 610, configured as described in reference to FIG. 1. The voltage divider 612 includes a p-channel current mirror 614 in tandem with an n-channel common gate differential transistor pair 616 connected through a resistor divider network 618 to ground. The current mirror 614 and differential transistor pair 616 form a buffer to provide a same potential on a source node 620 of the blocking transistor 604 to a top of the resistor divider network 618. The resistor divider network 618 reduces the potential at a top node top of the resistor divider network 618 by a factor of $N_{divider}$, for example 5 to 20, and provides the reduced potential to a non-inverting input 622 of the comparator 610. Forming the voltage divider 612 with the buffer of the current mirror 614 and differential transistor pair 616 may advantageously provide a higher speed of operation of the voltage divider 612 compared to voltage dividers with other circuit designs.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of operating an integrated circuit from a first voltage, comprising the steps of:
   putting a n-channel MOS blocking transistor having an operating voltage higher than the first voltage into an off state utilizing a first gate signal, wherein a source node of said blocking transistor is electrically isolated from a ground node of said integrated circuit;
   putting a n-channel MOS power transistor having an operating voltage higher than the first voltage into an off state utilizing a second gate signal distinct from the first gate signal and a n-channel MOS reference transistor having an operating voltage higher than the first voltage into an off state utilizing the second gate signal, wherein:
      a drain node of said power transistor is connected to a drain node of said blocking transistor;
      a source node of said power transistor is directly electrically connected to an instance of said ground node;
      a drain node of said reference transistor is connected in series to a reference current source; and
      a gate node of said power transistor is coupled to a gate node of said reference transistor;
   applying a high voltage to said power transistor drain node;
   putting said power transistor into an on state and said reference transistor into an on state; and
   putting said blocking transistor into an on state, wherein:
      said drain node of said reference transistor is connected to an inverting input of a comparator; and
      said source node of said blocking transistor is coupled to a non-inverting input of said comparator.

2. The process of claim 1, further including the step of monitoring an output of said comparator after said step of putting said blocking transistor into said on state is performed, wherein said comparator output provides an overcurrent signal when a potential at said comparator non-inverting input is higher than a potential at said comparator inverting input.

3. The process of claim 1, further including repeating said steps of:
   putting said high-voltage n-channel MOS blocking transistor into said off state;
   putting said high-voltage n-channel MOS power transistor into said off state and said high-voltage n-channel MOS reference transistor into said off state;
   applying said high voltage to said power transistor drain node;
   putting said power transistor into said on state and said reference transistor into said on state; and
   putting said blocking transistor into said on state.

4. The process of claim 1, further including a step of shutting down said integrated circuit, by a process including repeating said steps of:
   putting said high-voltage n-channel MOS blocking transistor into said off state; and
   putting said high-voltage n-channel MOS power transistor into said off state and said high-voltage n-channel MOS reference transistor into said off state.

5. The process of claim 1 wherein the operating voltage of the MOS blocking transistor, the MOS power transistor and the MOS reference transistor is at least substantially 300 V.

6. A method of detecting excess current in a power transistor on an integrated circuit operating from a first voltage, comprising the steps of:
   placing a MOS blocking transistor having operating voltage higher than the first voltage into an off state utilizing a first gate signal, wherein a source node of said blocking transistor is electrically isolated from a ground node of said integrated circuit;
   placing a MOS power transistor having a operating voltage greater than the first voltage into an off state utilizing a second gate signal distinct from the first gate signal and a MOS reference transistor having operating voltage greater than the first voltage into an off state utilizing the second gate signal, wherein:
      a first node of said power transistor is coupled to a drain node of said blocking transistor;
      a second node of said power transistor is electrically coupled to an instance of said ground node;
      a node of said reference transistor is coupled in series to a reference current source; and
      a gate node of said power transistor is coupled to a gate node of said reference transistor;
   applying a high voltage to said power transistor drain node;

placing said power transistor into an on state and said reference transistor into an on state; and placing said blocking transistor into an on state, wherein:

said drain node of said reference transistor is connected to an input of a comparator; and said source node of said blocking transistor is coupled to another input of said comparator, an output of the comparator being indicative of excess current flowing through the power transistor.

7. The process of claim 6 wherein the operating voltage of the MOS blocking transistor, the MOS power transistor and the MOS reference transistor is at least substantially 300 V.

\* \* \* \* \*